US012748256B2

(12) United States Patent
Yu et al.

(10) Patent No.: US 12,748,256 B2
(45) Date of Patent: Sep. 29, 2026

(54) OPTICAL DEVICES

(71) Applicant: Taiwan Semiconductor Manufacturing Co., Ltd., Hsinchu (TW)

(72) Inventors: Chen-Hua Yu, Hsinchu (TW); Chung-Hao Tsai, Huatan Township (TW); Chieh-Yen Chen, Taipei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 222 days.

(21) Appl. No.: 18/463,710

(22) Filed: Sep. 8, 2023

(65) Prior Publication Data

US 2025/0085472 A1 Mar. 13, 2025

(51) Int. Cl.

| | |
|---|---|
| ***G02B 6/12*** | (2006.01) |
| ***G02B 6/42*** | (2006.01) |
| ***G02B 6/43*** | (2006.01) |
| ***H10D 1/68*** | (2025.01) |
| ***H10W 20/20*** | (2026.01) |
| ***H10W 90/00*** | (2026.01) |

(52) U.S. Cl.

CPC ....... *G02B 6/12004* (2013.01); *G02B 6/4201* (2013.01); *G02B 6/4274* (2013.01); *G02B 6/43* (2013.01); *H10D 1/68* (2025.01); *H10W 20/20* (2026.01); *H10W 90/00* (2026.01); *G02B 2006/12061* (2013.01); *H10W 90/792* (2026.01)

(58) Field of Classification Search

CPC ...... G02B 6/12004; G02B 2006/12061; G02B 2006/12121; H01L 23/481; H01L 24/08; H01L 25/167; H01L 2224/08145; H01D 1/68

See application file for complete search history.

(56) References Cited

U.S. PATENT DOCUMENTS

| | | | | |
|---|---|---|---|---|
| 12,147,083 | B2 | 11/2024 | Sharma et al. | |
| 12,406,962 | B2 * | 9/2025 | Elsherbini | H01L 25/0652 |
| 2018/0254260 | A1 * | 9/2018 | Wei | H01L 25/0652 |
| 2020/0091124 | A1 * | 3/2020 | Liao | G02B 6/4201 |
| 2021/0159182 | A1 * | 5/2021 | Jeng | H10P 72/74 |
| 2022/0179159 | A1 | 6/2022 | Wu et al. | |
| 2022/0392871 | A1 * | 12/2022 | Lee | H01L 25/0655 |
| 2023/0089433 | A1 | 3/2023 | Li et al. | |

FOREIGN PATENT DOCUMENTS

| | | | |
|---|---|---|---|
| TW | 202242465 | A | 11/2022 |
| TW | 202323883 | A | 6/2023 |

* cited by examiner

*Primary Examiner* — Thomas A Hollweg
*Assistant Examiner* — Erin D Chiem
(74) *Attorney, Agent, or Firm* — Slater Matsil, LLP

(57) ABSTRACT

Optical devices are presented herein. In an embodiment, the optical devices comprise a first active layer of first optical components, a first metallization layer over the first active layer, a first capacitor located within the first metallization layer, a first bond layer over the first metallization layer, and a first semiconductor device bonded to the first bond layer.

20 Claims, 8 Drawing Sheets

OPTICAL DEVICES

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating long-range optical components and short-range electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
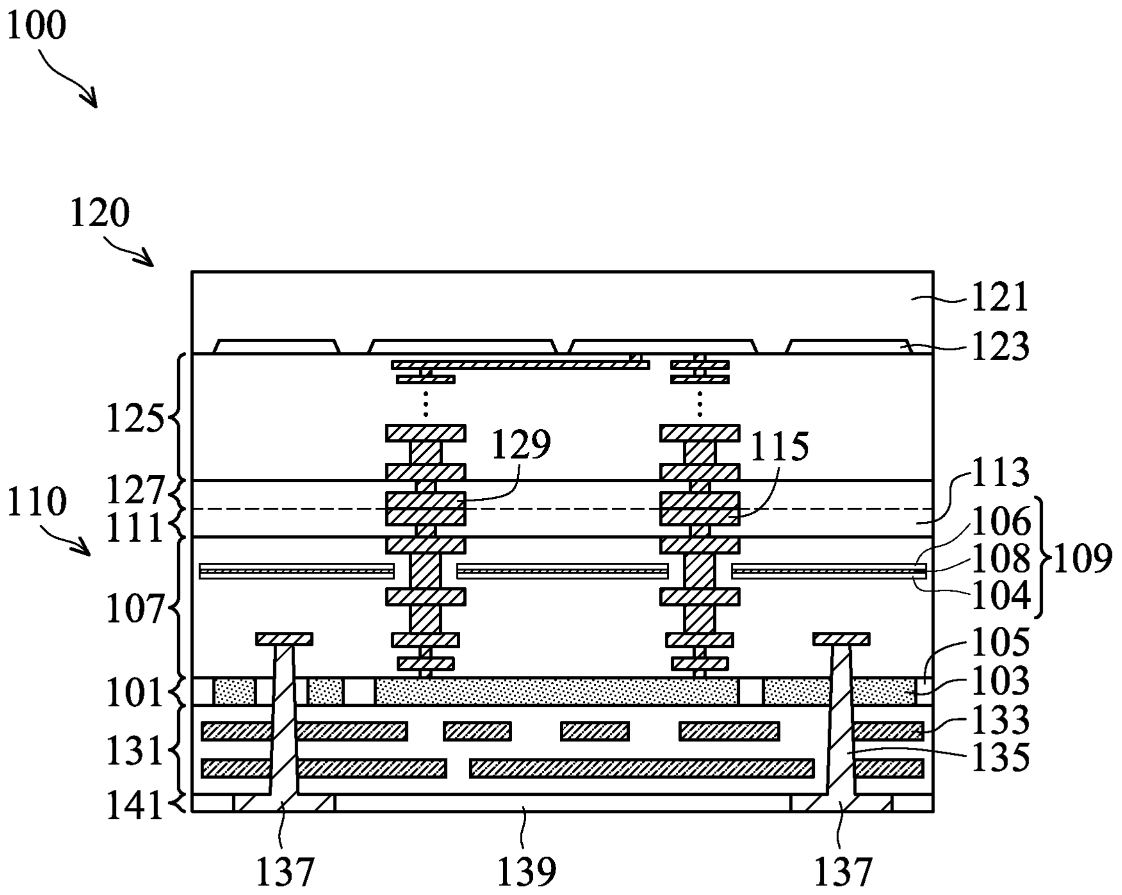
FIG. 1A illustrates a first optical package with an embedded capacitor, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be discussed with respect to certain embodiments in which one or more capacitors are integrated with optical devices within a photonic integrated circuit. However, the embodiments presented herein are intended to be illustrative and are not intended to limit the embodiments to the precise descriptions as discussed. Rather, the embodiments discussed may be incorporated into a wide variety of implementations, and all such implementations are fully intended to be included within the scope of the embodiments.

With reference now to FIG. 1A, there is illustrated a first optical device 100 that comprises an photonic integrated circuit (PIC) 110 and a first semiconductor device 120, in accordance with some embodiments. In the particular embodiment illustrated in FIG. 1A, the photonic integrated circuit 110 comprises a first active layer 101 of first optical components 103. In embodiments the first active layer 101 of the first optical components 103 may include such components as optical waveguides (e.g., ridge waveguides, rib waveguides, buried channel waveguides, diffused waveguides, etc.), couplers (e.g., grating couplers, edge couplers, etc.), directional couplers, optical modulators (e.g., Mach-Zehnder silicon-photonic switches, microelectromechanical switches, micro-ring resonators, etc.), amplifiers, multiplexors, demultiplexors, optical-to-electrical converters (e.g., P-N junctions), electrical-to-optical converters, lasers, combinations of these, or the like. However, any suitable first optical components 103 may be used.

A second insulating layer 105 surrounds and/or covers the first optical components 103 and provide additional cladding material. In an embodiment the second insulator layer 105 may be a dielectric layer that separates the individual components of the first active layer 101 from each other and from the overlying structures and can additionally serve as another portion of cladding material that surrounds the first optical components 103. In an embodiment the second insulating layer 105 may be silicon oxide, silicon nitride, germanium oxide, germanium nitride, combinations of these, or the like. However, any suitable material and method of manufacture may be used.

FIG. 1A further illustrates that first metallization layers 107 are used in order to electrically connect the first active layer 101 of first optical components 103 to control circuitry, to each other, and to subsequently attached devices. In an embodiment the first metallization layers 107 are alternating layers of dielectric and conductive material. In particular embodiments there may be multiple layers of metallization, such as about six metal layers, used to interconnect the various first optical components 103, but the precise number of first metallization layers 107 is dependent upon the design of the photonic integrated circuit 110.

In some embodiments the first metallization layers 107 can also include one or more first capacitors 109 within the first metallization layers 107 and electrically connected to conductive portions of the first metallization layers 107. In an embodiment the first capacitors 109 may be metal-insulator-metal (MIM) capacitors, super high performance metal-insulator-metal (SHP-MIM) capacitors, deep trench capacitors (DTC), stacked-capacitor (STC), combinations of these, or the like. In a particular embodiment in which the first capacitors 109 are MIM capacitors, each of the first capacitors 109 includes a lower metal layer 104, an upper metal layer 106 (e.g., copper layers) and a dielectric layer 108 (e.g., a high-k dielectric layer) between the metal layers. However, any suitable structures may be utilized.

The lower metal layer 104 of the first capacitor 109 may be electrically coupled to a conductive feature of the first metallization layers 107, e.g., through a via that extends from the lower metal layer 104 of the first capacitor 109 to the conductive feature of the first metallization layers 107. In addition, the plurality of first capacitors 109 may be electrically coupled in parallel to provide a large capacitance value. For example, the upper metal layers 106 of the first capacitors 109 may be electrically coupled together, and the lower metal layers 104 of the first capacitors 109 may be electrically coupled together.

A first bond layer 111 is located over the first metallization layers 107. In an embodiment, the first bond layer 111 may be used for a dielectric-to-dielectric and metal-to-metal bond. In accordance with some embodiments, the first bond layer 111 comprises a first dielectric material 113 such as silicon oxide, silicon nitride, or the like. However, any suitable materials may be utilized.

First bond pads 115 are located within the first bond layer 111. In an embodiment the first bond pads 115 comprise a seed layer and a plate metal, wherein the seed layer may comprise a copper layer and the plate metal may comprise copper, a copper alloy, or the like. A barrier layer (not separately illustrated) may be located along the first dielectric material 113 and the seed layer. The barrier layer may comprise titanium, titanium nitride, tantalum, tantalum nitride, or the like. In some embodiments a bond pad via may also be utilized to connect the first bond pads 115 with underlying conductive portions and, through the underlying conductive portions, connect the first bond pads 115 with the first metallization layers 107.

Additionally, the first bond layer 111 may optionally include one or more third optical components (not separately illustrated) incorporated within the first bond layer 111. In such an embodiment, the one or more third optical components may be similar materials as the one or more first optical components (described above), such as by being waveguides and other structures. However, any suitable structures and materials may be utilized.

The first semiconductor device 120 is bonded to the photonic integrated circuit 110. In some embodiments, the first semiconductor device 120 is an electronic integrated circuit (EIC—e.g., a device without optical devices) and may have a semiconductor substrate 121, a layer of active devices 123, an overlying interconnect structure 125, a second bond layer 127, and associated second bond pads 129. In an embodiment the semiconductor substrate 121 may be a semiconductor material such as silicon or silicon germanium, the active devices 123 may be transistors, capacitors, resistors, and the like formed over the semiconductor substrate 121, the interconnect structure 125 may be similar to the first metallization layers 107 (without optical components but with between about 1 and 14 metal layers), the second bond layer 127 may be similar to the first bond layer 111, and the second bond pads 129 may be similar to the first bond pads 115. However, any suitable devices may be utilized.

In an embodiment the first semiconductor device 120 may be configured to work with the photonic integrated circuit 110 for a desired functionality. In some embodiments the first semiconductor device 120 may be a high bandwidth memory (HBM) module, an xPU, a logic die, a 3DIC die, a CPU, a GPU, a SoC die, a MEMS die, combinations of these, or the like. Any suitable device with any suitable functionality, may be used, and all such devices are fully intended to be included within the scope of the embodiments.

The first semiconductor device 120 is bonded to the photonic integrated circuit 110 using, e.g., a dielectric-to-dielectric and metal-to-metal bond. In such an embodiment the first semiconductor device 120 is bonded to the first bond layer 111 of the photonic integrated circuit 110 by bonding both the first bond pads 115 to the second bond pads 129 and by bonding the dielectrics within the first bond layer 111 to the dielectrics within the second bond layer 127. However, while the above description describes a dielectric-to-dielectric and metal-to-metal bond, this is intended to be illustrative and is not intended to be limiting. In yet other embodiments, the photonic integrated circuit 110 may be bonded to the first semiconductor device 120 by metal-to-metal bonding. For example, the first semiconductor device 120 and the photonic integrated circuit 110 may be bonded by metal-to-metal bonding. Any suitable bonding may be utilized, and all such bonds are fully intended to be included within the scope of the embodiments.

FIG. 1A additionally illustrates a first passive layer 131 of fourth optical components 133 on a back side of the first active layer 101. In an embodiment the first passive layer 131 of fourth optical components 133 may use similar structures and similar materials as the second optical components of the first metallization layers 107. For example, the first passive layer 131 of fourth optical components 133 may be alternating layers of a cladding material such as silicon oxide and core material such as silicon nitride in structures such as waveguides and the like. In a particular embodiment the fourth optical components 133 comprise a plurality of silicon nitride waveguides surrounded by cladding material such as silicon oxide. However, any suitable structures and any suitable materials may be utilized.

FIG. 1A additionally illustrates first through dielectric vias (TDVs) 135 and third bond pads 137. In an embodiment the first through dielectric vias 135 extend through the first passive layer 131 and the first active layer 101 so as to provide a quick passage of power, data, and ground through the photonic integrated circuit 110. The first TDVs 135 electrically connect the first metallization layer 107, the first capacitors 109, and first semiconductor device 120 to an opposite side of the device.

In an embodiment the first through dielectric vias 135 comprise a liner, a barrier layer, and a first conductive material. The liner may be, e.g., an oxide formed from tetraethylorthosilicate (TEOS) or silicon nitride, although any suitable dielectric material may be used, a barrier layer (also not independently illustrated) is located adjacent to the liner, and the first conductive material may comprise copper, although other suitable materials such as aluminum, alloys, doped polysilicon, combinations thereof, and the like, may be utilized.

Optionally, in some embodiments a second metallization layer (not separately illustrated in FIG. 1A) may be located in electrical connection with the first through dielectric vias 135. In an embodiment the second metallization layers may be as described above with respect to the first metallization layers 107, such as being alternating layers of dielectric and conductive materials. However, any suitable structures may be utilized.

The third bond pads 137 may be located within a second dielectric material 139 of a third bond layer 141 and provide conductive regions for contact between either the first through dielectric vias 135 or the second metallization layers to other external devices. In an embodiment the third bond layer 141, the second dielectric material 139, and the third bond pads 137 may be similar to the first bond layer 111, the first dielectric material 113, and the first bond pads 115 described above. However, any suitable methods and materials may be utilized.

Optionally, while not specifically illustrated in FIG. 1A, the third bond pads 137 may be connected to further external connections for electrical connection to other devices. For example, the third bond pads 137 may be connected using dielectric-to-dielectric and metal-to-metal bonds, to microbumps, a ball grid array, combinations of these, or the like. However, any suitable physical and electrical connections may be utilized.

By utilizing the first capacitors 109 as described above, EIC processes may be utilized to integrate the first capacitors 109 within the first metallization layers 107 which helps to improve the power integrity of the first semiconductor device 120, thereby improving overall performance. As such, the first capacitors 109 can be located close to the first semiconductor device 120 with a smaller equivalent series resistance (ESR) and equivalent series inductance (ESL) and a density of capacitors between about 20 $nF/mm^2$ and about 100 $nF/mm^2$.

Figure 1B:
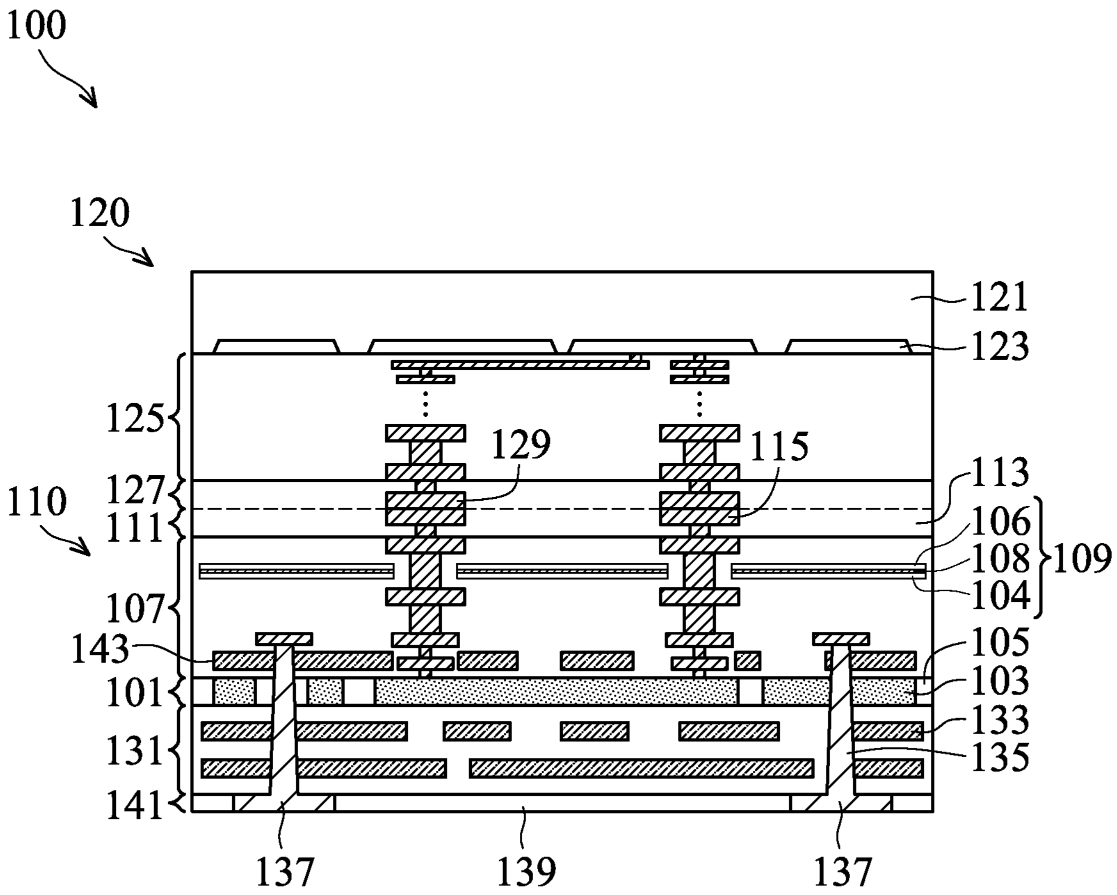
FIG. 1B illustrates the first optical package with optional silicon nitride waveguides, in accordance with some embodiments.

FIG. 1B illustrates an optional embodiment in which one or more second optical components 143 are included as part of the first metallization layers 107. In some embodiments the second optical components 143 of the first metallization layers 107 may include such components as couplers (e.g., edge couplers, grating couplers, etc.) for connection to outside signals, optical waveguides (e.g., ridge waveguides, rib waveguides, buried channel waveguides, diffused waveguides, etc.), optical modulators (e.g., Mach-Zehnder silicon-photonic switches, microelectromechanical switches, micro-ring resonators, etc.), amplifiers, multiplexors, demultiplexors, optical-to-electrical converters (e.g., P-N junctions), electrical-to-optical converters, lasers, combinations of these, or the like. In particular embodiments the one or more second optical components 143 are silicon nitride waveguides in optical connection with the underlying first optical components 103. However, any suitable optical components may be used for the one or more second optical components.

Figure 2A:
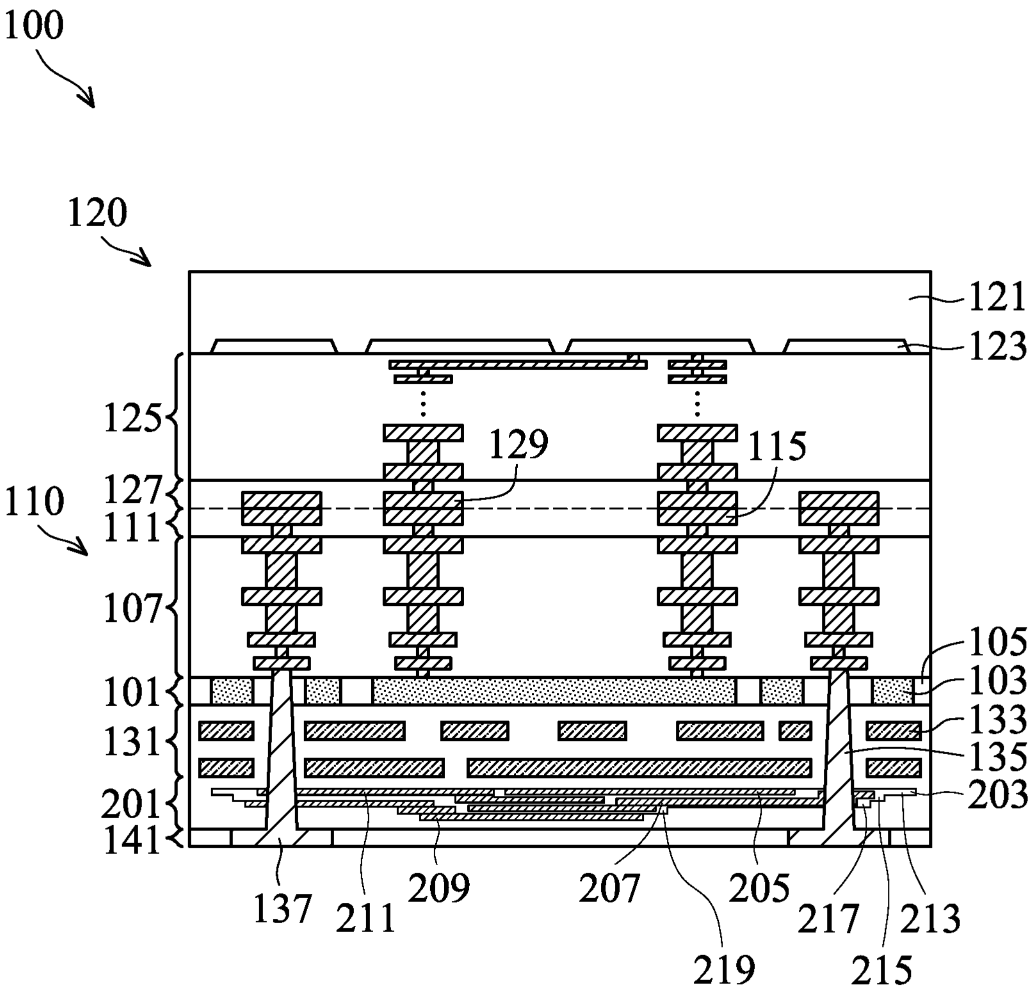
FIG. 2A illustrates a second optical package with an embedded capacitor, in accordance with some embodiments.

FIG. 2A illustrates another embodiment in which the photonic integrated circuit 110 is bonded to the first semiconductor device 120. In this embodiment, however, the first capacitors 109 are not formed within the first metallization layers 107 (as described above with respect to FIG. 1A), but are, instead, formed within a capacitor layer 201 on an opposite side of the first active layer 101 from the first semiconductor device 120. In this embodiment, the first semiconductor device 120, the first active layer 101, the first metallization layers 107 (with or without the first capacitors 109), and the first passive layer 131 may all be as described above with respect to FIG. 1A. However, any suitable structures may be utilized.

In this embodiment, however, the capacitor layer 201 is located adjacent to the first passive layer 131 and may comprise one or more second capacitors 203. In an embodiment the one or more second capacitors 203 may comprise super high performance metal-insulator-metal (SHP-MIM) capacitors, MIM capacitors, deep trench capacitors, combinations of these, or the like. However, any suitable type of capacitor can be utilized.

In a particular embodiment in which the second capacitors 203 are super high performance metal-insulator-metal (SHP-MIM), the second capacitors 203 comprises multiple plates which are respectively separated by multiple layers of capacitor dielectrics. In a particular embodiment the second capacitors 203 may comprise a first capacitor plate 205, a second capacitor plate 207, a third capacitor plate 209, and a fourth capacitor plate 211, wherein at least portions of the first capacitor plate 205, the second capacitor plate 207, the third capacitor plate 209, and the fourth capacitor plate 211 overlap each other. In this embodiment the first capacitor plate 205, the second capacitor plate 207, the third capacitor plate 209, and the fourth capacitor plate 211 may comprise conductive materials such as titanium nitride, TaN, TiAl, combinations of these, or the like, however, any suitable materials may be utilized.

Additionally, in this embodiment the first capacitor plate 205, the second capacitor plate 207, the third capacitor plate 209, and the fourth capacitor plate 211 are separated from each other by at least a first capacitor dielectric 213, a second capacitor dielectric 215, a third capacitor dielectric 217, and a fourth capacitor dielectric 219. In an embodiment the first capacitor dielectric 213, the second capacitor dielectric 215, the third capacitor dielectric 217, and the fourth capacitor dielectric 219 may be one or more layers of high-k dielectric materials, such as zirconium oxide, aluminum oxide, hafnium oxide, combinations of these, or the like. With all of the layers, the one or more second capacitors 203 may have a thickness of between about 10 Å and about 100 Å, such as about 1.4 kÅ. However, any suitable materials may be utilized.

In this embodiment the TDVs 135 extend through the one or more second capacitors 203 within the capacitor layer 201. The TDVs 135 electrically connect individual ones of the first capacitor plate 205, the second capacitor plate 207, the third capacitor plate 209, and the fourth capacitor plate 211 to each other (as desired), to the first metallization layer 107, to the first semiconductor device 120, and to the third bond pads 137 for external connections. In an embodiment the TDVs 135 may be as described above with respect to FIG. 1A. However, any suitable connective structures may be utilized.

Additionally, the third bond layer 141 with the second dielectric material 139 and the third bond pads 137 are located over the capacitor layer 201 and in electrical connection with the TDVs 135. As such, the third bond pads 137 provide electrical connection to the second capacitors 203.

Optionally, while not specifically illustrated in FIG. 2A, the third bond pads 137 may be connected to further external connections for electrical connection to other devices. For example, the third bond pads 137 may be connected using dielectric-to-dielectric and metal-to-metal bonds, to microbumps, a ball grid array, combinations of these, or the like. However, any suitable physical and electrical connections may be utilized.

By utilizing the second capacitors 203 within the capacitor layer 201 as described above, the second capacitors 203 (e.g., a SHP-MIM) may be integrated into the backside of the photonic integrated circuit 110 using 3 nm node and/or 2 nm node processes. As such, the capacitor density may be flexibly selected (e.g., 33, 66, 100 nF/mm$^2$) without extensive redesign. As such, greater flexibility for the devices can be obtained.

Figure 2B:
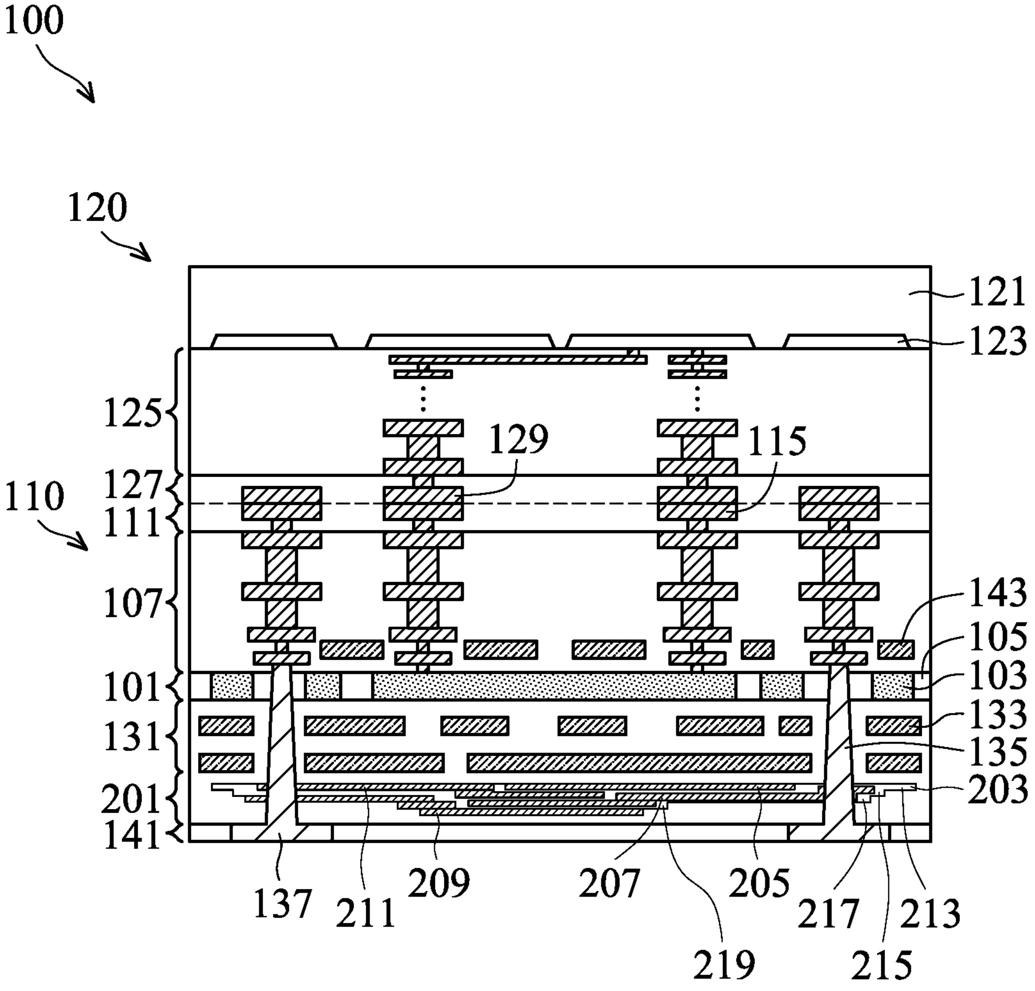
FIG. 2B illustrates the second optical package with optional silicon nitride waveguides, in accordance with some embodiments.

FIG. 2B illustrates an optional embodiment of the structure illustrated in FIG. 2A above, but which includes the optional one or more second optical components 143 within the first metallization layer 107. In a particular embodiment the one or more second optical components 143 may comprise silicon nitride waveguides. However, any suitable components may be utilized.

Figure 3:
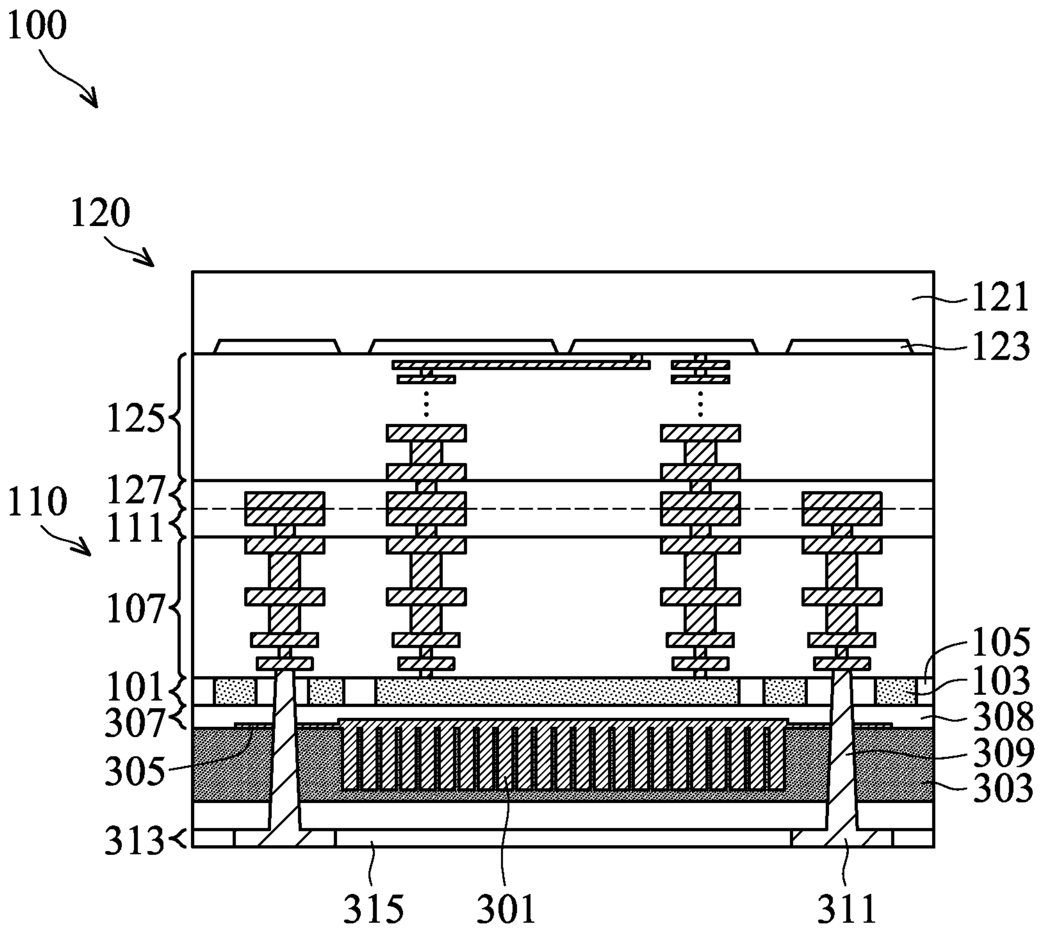
FIG. 3 a third optical package with capacitors within a substrate, in accordance with some embodiments.

FIG. 3 illustrates yet another embodiment in which the photonic integrated circuit 110 is bonded to the first semiconductor device 120 with a capacitor. In this embodiment, however, third capacitors 301, instead of being located within the capacitor layer 201 (as described above with respect to FIG. 2A) or being located within the first metallization layer 107 (as described above with respect to FIG. 1A), are located within a second substrate 303 on an opposite side of the first active layer 101 from the first semiconductor device 120. In an embodiment the second substrate 303 may be a semiconductor material such as silicon or germanium, a dielectric material such as glass, or any other suitable material that allows for structural support of overlying devices.

The third capacitors 301 may be formed either on or at least partially within the second substrate 303. In some embodiments the third capacitors 301 may be deep trench capacitors, MIM capacitors, SHP-MIM capacitors, combinations of these, or the like. However, any suitable capacitors may be utilized.

In an embodiment in which the third capacitors 301 are deep trench capacitors, the third capacitors 301 extend into the second substrate 303 and comprise multiple layers of a conductive material (not separately illustrated in FIG. 3) alternated with layers of a dielectric material (also not separately illustrated in FIG. 3). The third capacitors 301 may be interconnected in a parallel arrangement, and may have a thickness of between about 5 μm and about 8 μm.

A liner may be used to separate the material of the third capacitors 301 from the second substrate 303, and the deep trench capacitors may comprise a series of alternating layers of conductive material and dielectric material. In an embodiment the liner may be a dielectric material such as silicon oxide, the conductive material may be a conductive material such as titanium nitride, and the dielectric material may be one or more layers of high-k dielectric materials, such as zirconium oxide, aluminum oxide, hafnium oxide, combinations of these, or the like. In a particular embodiment there are four layers of the conductive material and three layers of the dielectric material. However, any suitable materials and number of alternating layers may be utilized.

A third metallization layer 307 with contacts 305 are located over the third capacitors 301 in order to provide electrical connection between, e.g., the third capacitors 301 and the TDVs 135. In an embodiment the third metallization layer 307 and the contacts 305 may be similar to the first metallization layer 107 (with or without the optical devices) such as by utilizing one more layers of alternating third dielectric materials 308 and conductive material to form the contacts 305 and any other desired conductive connections. However, any suitable materials may be utilized to form the third metallization layer 307 with the contacts 305.

In a particular embodiment the second substrate 303, the third dielectric material 308 and the original material for the first optical components 103 may be formed as part of a silicon-on-insulator (SOI) substrate. In other embodiments the second substrate 303, the third dielectric material 308, and the original material for the first optical components 103 are not part of a SOI substrate, and may be sequentially formed over the second substrate 303. Any suitable structures may be utilized.

In this embodiment second TDVs 309 extend through the second substrate 303, the third metallization layer 307, the first active layer 101 and to the first metallization layer 107, and utilizes the contacts 305 to electrically connect to the third capacitors 301. The second TDVs 309 electrically connect individual ones of the contacts 305 and the third capacitors 301 to the first metallization layer 107, to the first semiconductor device 120, and to the third bond pads 137 for external connections. In an embodiment the second TDVs 309 may be similar to the TDVs 135 as described above with respect to FIG. 1A. However, any suitable connective structures may be utilized.

Additionally, a fourth bond layer 313 with fourth bond pads 311 in a fourth dielectric material 315 is in electrical connection with the second TDVs 309 in order to provide for external connections. In an embodiment the fourth bond layer 313, the fourth dielectric material 315, and the fourth bond pads 311 may be similar to the third bond layer 141, the second dielectric material 139, and the third bond pads 137, described above with respect to FIG. 1A. However, any suitable connection structures may be utilized.

Optionally, while not specifically illustrated in FIG. 3, the fourth bond pads 311 may be connected to further external connections for electrical connection to other devices. For example, the fourth bond pads 311 may be connected using dielectric-to-dielectric and metal-to-metal bonds, to microbumps, a ball grid array, combinations of these, or the like. However, any suitable physical and electrical connections may be utilized.

By utilizing the third capacitors 301 within the second substrate 303 as described above, the third capacitors 301 (e.g., deep trench capacitors) may be integrated into the SOI carrier of the photonic integrated circuit 110 using, e.g., a chip on wafer on substrate (CoWoS) integrated capacitor (iCAP) process. As such, the capacitor density may be increased to about 1100 nF/mm$^2$. As such, greater flexibility for the devices can be obtained.

Figure 4A:
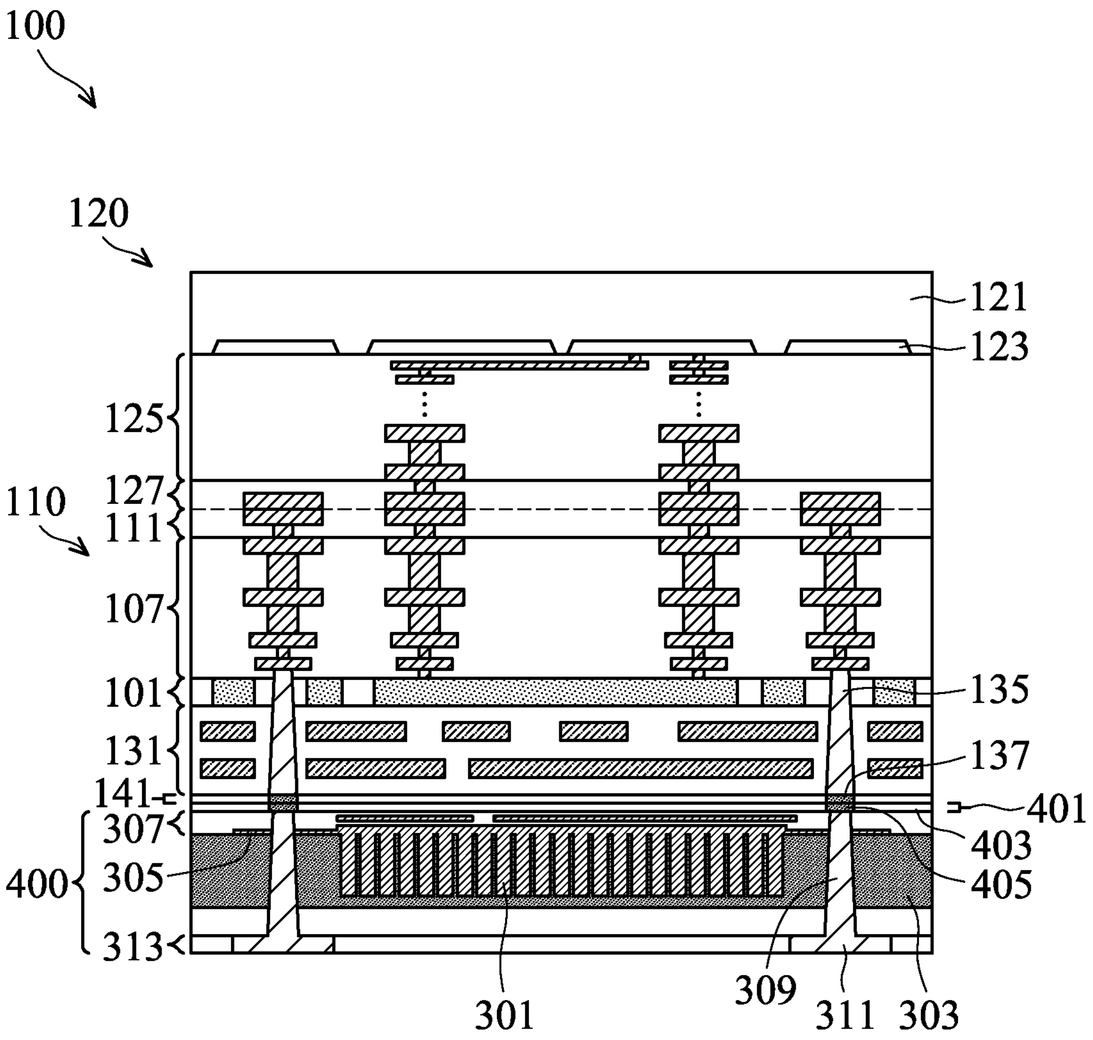
FIG. 4A illustrates a fourth optical package with capacitors located within a second substrate, in accordance with some embodiments.

FIG. 4A illustrates yet another embodiment in which capacitors are integrated on an opposite side of the first active layer 101 from the first semiconductor device 120. In this embodiment, however, instead of the capacitors being located within the first metallization layer 107 (as described above with respect to FIG. 1A), or being located adjacent to the first passive layer 131 (as described above with respect to FIG. 2A), or being located within the second substrate 303 without the first passive layer 131 (as described above with respect to FIG. 3), the third capacitors 301 are located within a separate capacitor structure 400 that includes the second substrate 303 and the separate capacitor structure 400 is located adjacent to the first passive layer 131.

In this embodiment, the photonic integrated circuit 110 and the first semiconductor device 120 may be as described above with respect to FIG. 1A, but the first capacitors 109 are not formed within the first metallization layer 107. In particular, the first passive layer 131, the TDVs 135, and the third bond pads 137 are present within the photonic integrated circuit 110 without the third capacitors 301 within the second substrate 303 being present within the photonic integrated circuit 110.

Rather, the third capacitors 301 within the second substrate 303, the third metallization layer 307 with the contacts 305, the second TDVs 309, and the fourth bond pads 311 are separate from the photonic integrated circuit 110. In this embodiment the third capacitors 301 within the second substrate 303, the third metallization layer 307 with the contacts 305, the second TDVs 309, and the fourth bond pads 311 are separate from the photonic integrated circuit 110 and are bonded to the photonic integrated circuit 110 using, e.g., a fifth bond layer 401. In an embodiment the fifth bond layer 401 may comprise a fifth dielectric material 403 and fifth bond pads 405, and the fifth bond layer 401, the fifth dielectric material 403, and the fifth bond pads 405 may be similar to the fourth bond layer 313, the fourth dielectric material 315, and the fourth bond pads 311. Additionally, the fifth bond layer 401 may be bonded to the photonic integrated circuit 110 using, e.g., a dielectric-to-dielectric and metal-to-metal bond, although any suitable bonding may be utilized.

Optionally, while not specifically illustrated in FIG. 4A, the fourth bond pads 311 may be connected to further external connections for electrical connection to other devices. For example, the fourth bond pads 311 may be connected using dielectric-to-dielectric and metal-to-metal bonds, to microbumps, a ball grid array, combinations of these, or the like. However, any suitable physical and electrical connections may be utilized.

By utilizing the third capacitors 301 within the second substrate 303 that is bonded to the photonic integrated circuit 110 instead of being integrated as part of the photonic integrated circuit 110, the third capacitors 301 (e.g., deep trench capacitors) may be integrated within a capacitor structure 400 which is then bonded to the structure. As such, the capacitor density may be increased to about 1100 nF/mm$^2$ while still improving the design and process flexibility. As such, greater flexibility for the devices can be obtained.

Figure 4B:
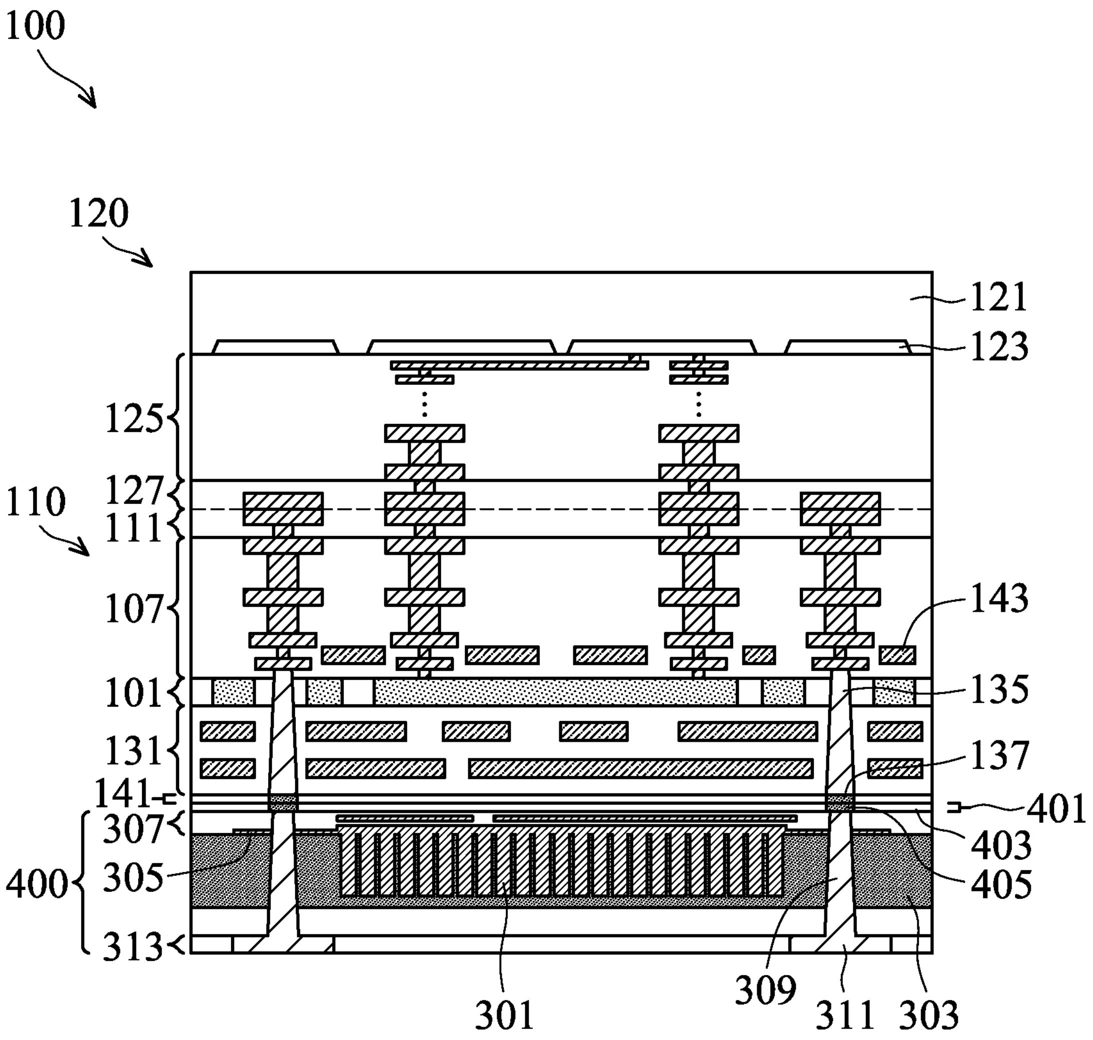
FIG. 4B illustrates the fourth optical package with optional silicon nitride waveguides, in accordance with some embodiments.

FIG. 4B illustrates an optional embodiment of the structure illustrated in FIG. 4A above, but which includes the optional one or more second optical components 143 within the first metallization layer 107. In a particular embodiment the one or more second optical components 143 may comprise silicon nitride waveguides. However, any suitable components may be utilized.

Figure 5:
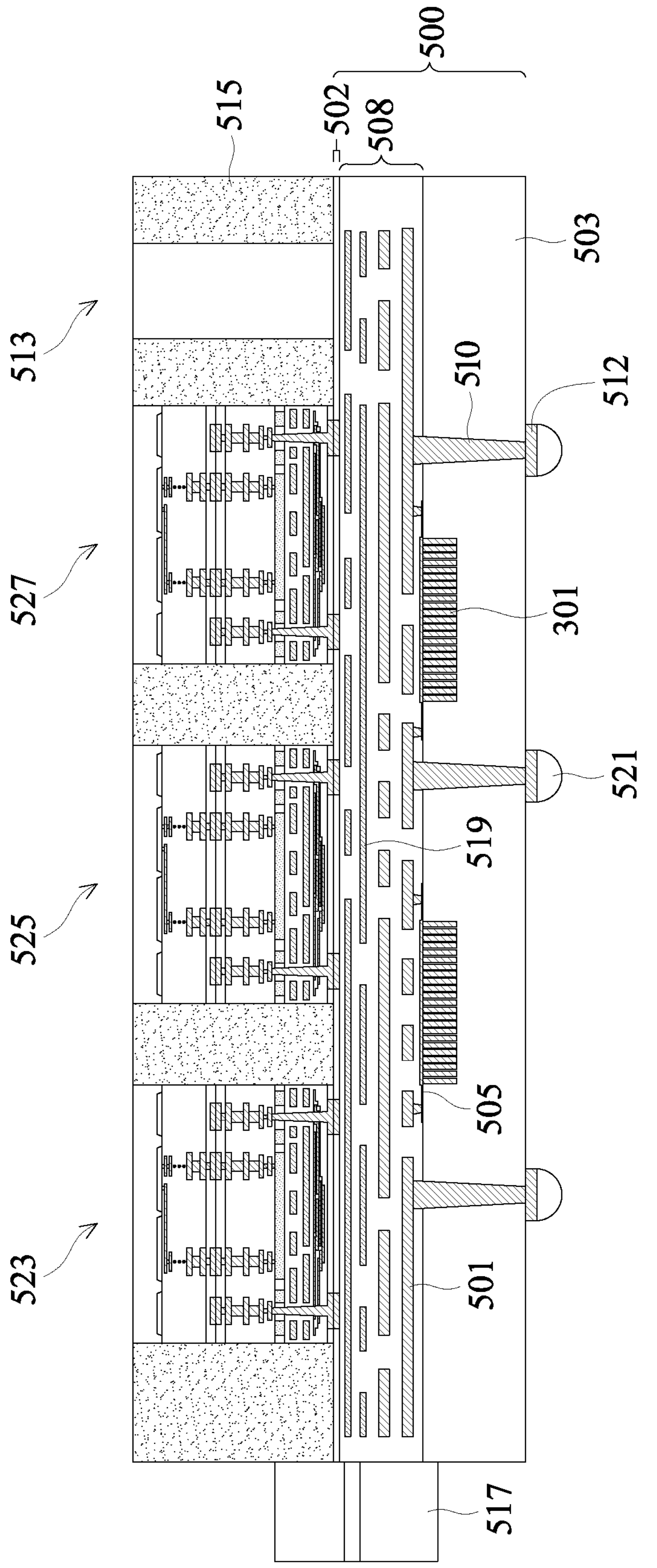
FIG. 5 illustrates multiple optical packages bonded to a capacitor structure, in accordance with some embodiments.

FIG. 5 illustrates an embodiment in which multiple ones of the first optical device 100 are bonded to a separate interposer structure 500, which is a composite interposer in this embodiment. In the embodiment illustrated in FIG. 5, the interposer structure 500 comprises a third substrate 503 (similar to the second substrate 303), the third capacitors 301 formed within the third substrate 503, fifth bond pads 512 (similar to the fourth bond pads 311), a sixth bond layer 502 (similar to the fifth bond layer 401), and third TDVs 510 (similar to the second TDVs 309). Additionally, a fourth metallization layer 508 (similar to the third metallization layer 307) comprises not only second contacts 505 (similar to the contacts 305), but additionally comprises conductive lines 501 and third optical devices 519.

Additionally, in this embodiment external connections 521 may be placed on the fifth bond pads 512. In an embodiment the external connections 521 may be a bump such as a solder ball, a microbump, or a ball grid array. However, any suitable external connection, such as a copper pillar, may be utilized.

In this embodiment multiple ones of the first optical device 100, such as a first optical structure 523, a second optical structure 525, and a third optical structure 527, are bonded to the sixth bond layer 523. Each of the first optical structure 525, the second optical structure 525, and the third optical structure 527 may be any of the first optical devices

100 described above with respect to FIGS. 1-4, and the first semiconductor device 120 within each of the first optical structure 523, the second optical structure 525, and the third optical structure 527 may have different functions that work together. For example, the first semiconductor device 120 within the first optical structure 523 may be a graphics processing unit (GPU), the first semiconductor device 120 within the second optical structure 525 may be a central processing unit (CPU) and the first semiconductor device 120 within the third optical structure 511 may be a memory device. However, any suitable functionalities may be utilized.

The first optical structure 523, the second optical structure 525, and the third optical structure 527 are bonded to the sixth bond layer 502 of the interposer structure 500. In an embodiment the first optical structure 523, the second optical structure 525, and the third optical structure 527 are bonded using a dielectric-to-dielectric and metal-to-metal bond. However, any suitable bonding, such as through the use of microbumps, ball grid arrays, or the like, may be utilized.

Additionally, in this embodiment a laser die 513 may also be bonded to the interposer structure 500. In some embodiments, the laser die 513 may be utilized to generate light in order to power the other optical components (e.g., the first optical components 103, the second optical components, the third optical components, etc. within the first optical structure 523, the second optical structure 525, the third optical structure 527, etc.), and may comprise light generating structures such as one or more laser diodes (not separately illustrated). In particular embodiments the laser diodes may be Fabry-Perot Diodes, and may be based on III-V materials, II-VI materials, or any other suitable set of materials.

In a particular embodiment the laser die 513 may comprise a first contact, a first buffer layer, a first active diode layer comprising multiple quantum wells (MQWs), a second buffer layer, and a second contact in order to generate the desired light. Additionally, the generated light may be output from the laser die 513 through, e.g., the first contact and into the fourth metallization layer 508. However, any suitable structures may be utilized in order to form the laser die 513 and generate the desired light.

The laser die 513 may be bonded to the interposer structure 500. In an embodiment the laser die 513 may be bonded using a dielectric-to-dielectric and metal-to-metal bond. However, any suitable bonding may be utilized.

Additionally, the first optical structure 523, the second optical structure 525, the third optical structure 527, and the laser die 513 are encapsulated with an encapsulant 515. In an embodiment, the encapsulant 515 may be a molding compound, epoxy, or the like, and may or may not have top surfaces which are planar with top surfaces of the first optical structure 523, the second optical structure 525, the third optical structure 525, and the laser die 513.

An optical fiber 517 is utilized as an optical input/output port to the interposer structure 500. In an embodiment the optical fiber 517 is placed so as to optically couple the optical fiber 517 and an optical input such as an edge coupler that is part of the third optical devices 519 within the fourth metallization layer 508. By positioning the optical fiber 517 as such, optical signals leaving the optical fiber 517 are directed towards, e.g., the third optical devices 519 within the fourth metallization layer 508 and, from there, to and between the first optical structure 523, the second optical structure 525, the third optical structure 527. Similarly, the optical fiber 517 is positioned so that optical signals leaving the third optical devices 519 of the fourth metallization layer 508 are directed into the optical fiber 517 for transmission. However, any suitable location may be utilized.

The optical fiber 517 may be held in place using, e.g., an optical glue (not separately illustrated in FIG. 5). In some embodiments, the optical glue comprises a polymer material such as epoxy-acrylate oligomers, and may have a refractive index between about 1 and about 3. However, any suitable material may be utilized.

In an embodiment, a semiconductor device includes: a first active layer of first optical components; a first metallization layer over the first active layer; a first capacitor located within the first metallization layer; a first bond layer over the first metallization layer; and a first semiconductor device bonded to the first bond layer. In an embodiment the first capacitor is a metal-insulator-metal capacitor. In an embodiment the device further includes a second active layer of second optical components on an opposite side of the first active layer from the first metallization layer. In an embodiment the device further includes through device vias extending through the second active layer and the first active layer. In an embodiment the device further includes a second bond layer in electrical connection with the through device vias. In an embodiment the first semiconductor device is bonded to the first bond layer using a dielectric-to-dielectric and metal-to-metal bond. In an embodiment the first capacitor has a density of about 20 $nF/mm^2$ and about 100 $nF/mm^2$.

In another embodiment, a semiconductor device includes: a first semiconductor device bonded to a first bond layer; a first metallization layer on an opposite side of the first bond layer from the first semiconductor device; a first active layer of first optical components on an opposite side of the first metallization layer from the first bond layer; and a first capacitor on an opposite side of the first active layer from the first metallization layer. In an embodiment the first capacitor is a super high performance metal-insulator-metal. In an embodiment the semiconductor device further includes a second bond layer located on an opposite side of the first capacitor from the first active layer. In an embodiment the first capacitor is a deep trench capacitor located within a semiconductor substrate. In an embodiment the semiconductor device further includes a second bond layer located between the first capacitor and the first active layer. In an embodiment the semiconductor device further includes a second active layer of second optical components located between the first capacitor and the first active layer. In an embodiment the semiconductor device further includes a through device via extending through the semiconductor substrate and the first active layer and at least partially into the first metallization layer.

In yet another embodiment a semiconductor device includes: a capacitor structure, the capacitor structure includes: a semiconductor substrate; a deep trench capacitor extending into the semiconductor substrate; and a metallization layer over the semiconductor substrate, the metallization layer comprising first optical components; a first optical structure bonded to the capacitor structure, the first optical structure includes: a first semiconductor device; a first active layer of first optical components; a first metallization layer between the first semiconductor device and the first active layer; and a first capacitor between the first semiconductor device and the capacitor structure; and a second optical structure bonded to the capacitor structure, the second optical structure includes: a second semiconductor device; a second active layer of second optical components; a second metallization layer between the second semiconductor device and the second active layer; and a second capacitor between the second semiconductor device and the capacitor structure. In an embodiment the first semiconductor device is a graphics processing unit and the second semiconductor device is a central processing unit. In an embodiment the first semiconductor device further includes a laser die bonded to the capacitor structure. In an embodiment the laser die, the first optical device and the second optical device are encapsulated with an encapsulant. In an embodiment the first semiconductor device further includes an optical fiber aligned with an edge coupler within the metallization layer. In an embodiment the second capacitor is located between the second active layer and the capacitor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a first optical structure comprising:
- a first active layer of first optical components;
- a first metallization layer over the first active layer;
- a first capacitor located within the first metallization layer;
- a first bond layer over the first metallization layer; and
- a first semiconductor device bonded to the first bond layer;

a second optical structure comprising:
- a second active layer of second optical components;
- a second metallization layer over the second active layer;
- a second capacitor located within the second metallization layer;
- a second bond layer over the second metallization layer; and
- a second semiconductor device bonded to the second bond layer;

a capacitor structure bonded to both the first optical structure and the second optical structure, wherein the first capacitor is between the first semiconductor device and the capacitor structure and wherein the second capacitor is between the second semiconductor device and the capacitor structure, the capacitor structure comprising:
- a third semiconductor substrate;
- a deep trench capacitor extending into the semiconductor substrate; and
- a third metallization layer over the third semiconductor substrate, the third metallization layer comprising third optical components.

2. The semiconductor device of claim 1, wherein the first optical components comprise:

active optical devices; and a silicon waveguide.

3. The semiconductor device of claim 2, wherein the first capacitor is a metal-insulator-metal capacitor.

4. The semiconductor device of claim 3, further comprising a layer of optical waveguides on an opposite side of the first active layer from the first metallization layer.

5. The semiconductor device of claim 4, further comprising through device vias extending through the layer of optical waveguides and the first active layer.

6. The semiconductor device of claim 1, further comprising a second bond layer in electrical connection with through dielectric vias.

7. The semiconductor device of claim 1, wherein the first semiconductor device is bonded to the first bond layer using a dielectric-to-dielectric and metal-to-metal bond.

8. A semiconductor device comprising:
- a capacitor structure comprising:
  - a semiconductor substrate; and
  - a deep trench capacitor extending into the semiconductor substrate;
- a first optical device comprising:
  - a first semiconductor device bonded to a first bond layer;
  - a first metallization layer on an opposite side of the first bond layer from the first semiconductor device;
  - a first active layer of first optical components on an opposite side of the first metallization layer from the first bond layer; and
  - a first capacitor between the first semiconductor device and the capacitor structure; and
- a second optical device comprising:
  - a second semiconductor device bonded to a second bond layer;
  - a second metallization layer on an opposite side of the second bond layer from the second semiconductor device;
  - a second active layer of second optical components on an opposite side of the second metallization layer from the second bond layer; and
  - a second capacitor between the second semiconductor device and the capacitor structure.

9. The semiconductor device of claim 8, wherein the first active layer of the first optical components comprises:
- active optical devices; and
- at least one silicon waveguide.

10. The semiconductor device of claim 8, wherein the first capacitor is a multiple layer metal-insulator-metal structures.

11. The semiconductor device of claim 8, wherein the first capacitor is a deep trench capacitor located within a semiconductor substrate.

12. The semiconductor device of claim 11, further comprising a second bond layer located between the first capacitor and the first active layer.

13. The semiconductor device of claim 11, further comprising a layer of optical waveguides located between the first capacitor and the first active layer.

14. The semiconductor device of claim 11, further comprising a through dielectric via extending through the semiconductor substrate and the first active layer and at least partially into the first metallization layer.

15. A semiconductor device comprising:
- an interposer structure, the interposer structure comprising;
  - a semiconductor substrate;
  - a deep trench capacitor extending into the semiconductor substrate; and
  - a metallization layer over the semiconductor substrate, the metallization layer comprising first optical components;
- a first optical structure bonded to the interposer structure, the first optical structure comprising:
  - a first semiconductor device;
  - a first active layer of first optical components;
  - a first metallization layer between the first semiconductor device and the first active layer; and
  - a first capacitor between the first semiconductor device and the interposer structure; and
- a second optical structure bonded to the interposer structure, the second optical structure comprising:
  - a second semiconductor device;
  - a second active layer of second optical components;
  - a second metallization layer between the second semiconductor device and the second active layer; and
  - a second capacitor between the second semiconductor device and the interposer structure.

16. The semiconductor device of claim 15, wherein the interposer structure comprises a third capacitor.

17. The semiconductor device of claim 16, wherein a laser die, the first optical structure and the second optical structure are encapsulated with an encapsulant.

18. The semiconductor device of claim 17, further comprising an optical fiber aligned with an edge coupler within the metallization layer.

19. The semiconductor device of claim 15, wherein the deep trench capacitor is located between the second active layer and the interposer structure.

20. The semiconductor device of claim 15, wherein the first semiconductor device is a high bandwidth memory module.

* * * * *